United States Patent [19]

Bottomley

[11] Patent Number: 4,585,993
[45] Date of Patent: Apr. 29, 1986

[54] METHOD FOR SELECTIVE NMR IMAGING OF CHEMICALLY-SHIFTED NUCLEI

[75] Inventor: Paul A. Bottomley, Clifton Park, N.Y.

[73] Assignee: General Electric Company, Schenectady, N.Y.

[21] Appl. No.: 561,381

[22] Filed: Dec. 14, 1983

[51] Int. Cl.⁴ .............................................. G01R 33/20
[52] U.S. Cl. .................................... 324/309; 324/310
[58] Field of Search .............. 324/300, 307, 309, 308, 324/311, 312, 313, 314, 317, 310

[56] References Cited

U.S. PATENT DOCUMENTS 4,361,807 11/1982 Burl et al. .......................... 324/310

Primary Examiner—Michael J. Tokar
Attorney, Agent, or Firm—Geoffrey H. Krauss; James C. Davis, Jr.; Marvin Snyder

[57] ABSTRACT

A method for providing NMR images free of chemical shift artifacts, obtained from selected nuclei of a sample containing nuclei having chemically-shifted NMR frequencies is described. Non-selected nuclei of the sample are selectively saturated prior to applying an NMR imaging sequence by applying to the sample an RF pulse containing frequencies equal to the chemically-shifted frequencies of the non-selected nuclei and having a narrow frequency spectrum about the chemically-shifted frequencies. Alternatively, selected nuclei are directly excited during application of an NMR imaging sequence by applying to the sample an RF pulse containing frequencies equal to the chemically-shifted frequencies of the selected nuclei, and having a narrow frequency spectrum about the chemically-shifted frequencies so as to exclude signal contributions from the non-selected nuclei. These selective pulses are applied in the absence of the imaging magnetic field gradients.

58 Claims, 8 Drawing Figures

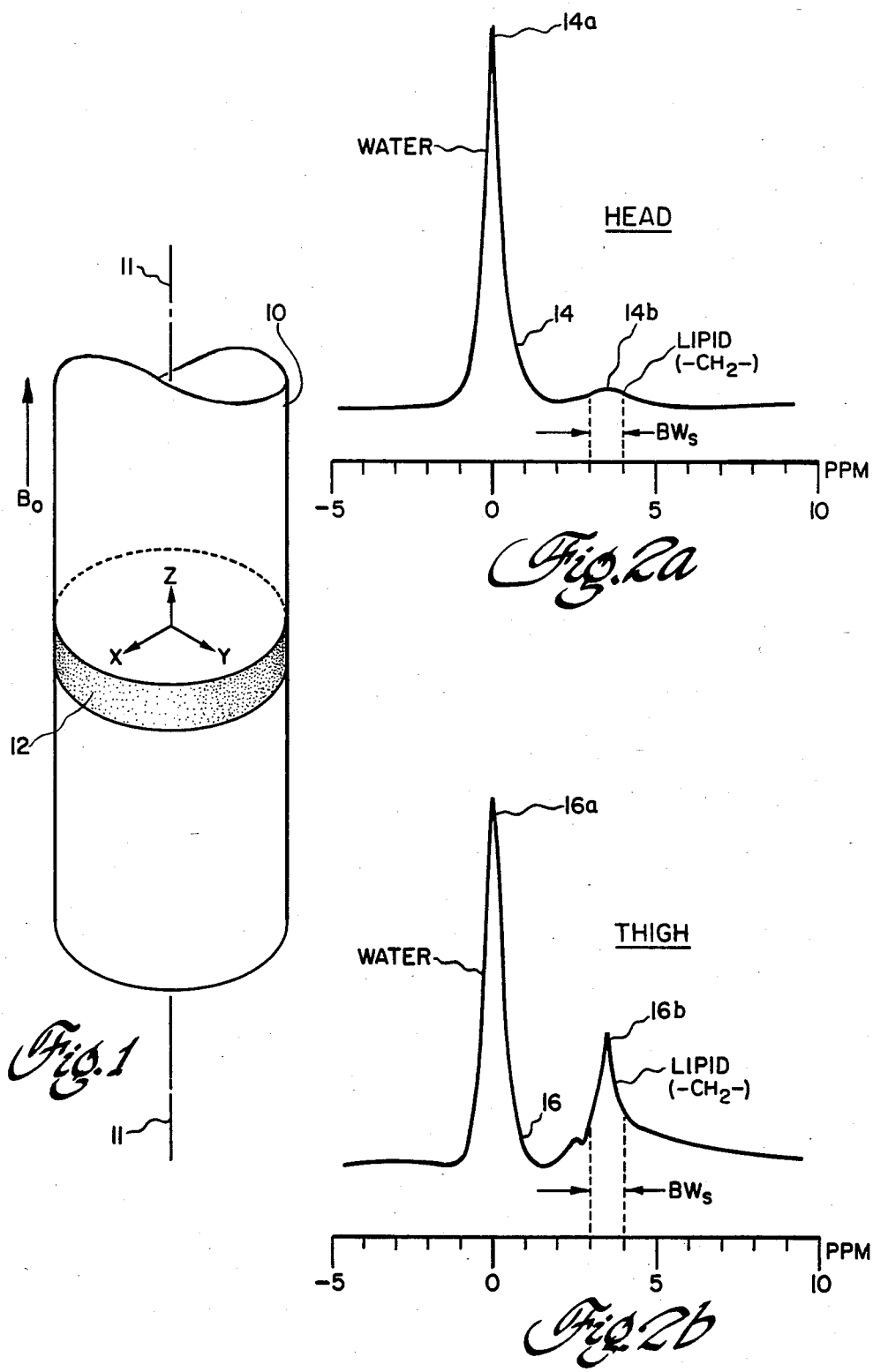

METHOD FOR SELECTIVE NMR IMAGING OF CHEMICALLY-SHIFTED NUCLEI

BACKGROUND OF THE INVENTION

This invention relates to nuclear magnetic resonance (NMR) imaging and, more particularly, to methods for overcoming chemical shift artifacts in NMR imaging by imaging with selected nuclei of a sample containing nuclei of the same, or different, species having chemically-shifted NMR frequencies.

As is well known, the nuclear magnetic resonance phenomenon is exhibited by atomic nuclei with an odd number of either protons or neutrons. Such nuclei possess spin, which endows them with a small magnetic field. When placed in an externally applied static main magnetic field, $B_o$, the nuclei tend to align themselves with the applied field and produce a net magnetization, M, in the direction of the applied field. The nuclei oscillate or precess about the axis of the applied field with a characteristic NMR frequency, $\omega$, given by the Larmor equation:

$$\omega = \gamma B_o \qquad (1)$$

where $\gamma$ is the gyromagnetic ratio and is constant for each NMR isotope. If a time-dependent (RF) magnetic field, having frequency components equal to the Larmor frequencies of the nuclei, is applied in a direction orthogonal to the main field, then the nuclei will absorb energy and nutate away from the axis of the main field and commence to precess at the Larmor frequency about the new net applied field direction. If the RF pulse is turned off precisely when the angle of nutation reaches 90°, the magnetization is left in the transverse, or x-y, plane and the net magnetization now precesses about $B_o$ in the transverse plane at the Larmor frequency. Such a pulse is termed a 90° pulse. A 180° pulse is one which nutates the magnetization through 180°, inverting it. These two types of RF pulse form the basic tools of the NMR spectroscopist.

Experimentally, the NMR signal is detected by a tuned RF coil with axis perpendicular to $B_o$. The same coil used for excitation is also suitable for detection, or alternatively, a separate, mutually orthogonal, coil can be used. The oscillating NMR magnetization induces a voltage in the coil, analogous to the principle of an electric generator. The induced signal immediately following an RF pulse is termed a free induction decay (FID), reflecting the decay in the time signal as nuclei relax back to equilibrium in alignment with the main field or which signal decays due to dephasing caused by inhomogeneities in the main field. These NMR signals may be detected and Fourier-transformed to derive the frequency components of the NMR signals characteristic of the excited nuclei.

Nuclei of the same isotope can exhibit minute variations in their NMR frequencies, which are referred to as chemical shifts, because of differences in their chemical environments which cause differences in their local magnetic field environments. Chemical shifts result from alterations of the magnetic field around nuclei as a result of the shielding currents that are associated with the distribution of electrons around adjacent atoms. The degree of shielding is characteristic of the environment of the nucleus, and thus the chemical shift spectrum of a given molecule is unique and can be used for identification. In conventional NMR spectroscopy, chemically-shifted signals are observed from the whole of an NMR sample for studying the chemical structure of the sample. Because the resonant frequency and the absolute chemical shift are dependent upon the strength of the field, the chemical shift is expressed as a fractional shift in parts-per-million (ppm) of the resonant frequency relative to an arbitrary reference compound.

Since the Larmor frequency is proportional to the magnetic field, if the magnetic field varies spatially in a sample, then so does the resonant frequency of the nuclei. In NMR imaging, at least one magnetic field gradient is applied to the sample to spatially encode the emitted NMR signals. If, in the presence of gradients, an RF excitation pulse having a narrow range of frequency components is applied to the nuclei in a selected region, e.g., a slice or a selected point of the sample, this region is selectively excited and the NMR signals from the selected region can be detected. The data collected from different regions or points of the sample can be processed in a well-known manner to construct an image.

NMR imaging in the past has typically been performed in rather low magnetic fields and chemical shifts have not been a significant problem. In magnetic fields below about 0.5 T, chemical shifts are difficult to observe because the chemical shifts are comparable to the natural linewidths of the resonances and the low sensitivity of nuclei other than hydrogen ($^1H$). It is desirable, however, to perform NMR imaging in higher magnetic fields, e.g. in fields in excess of 1 T, because of the improved signal-to-noise ratios realized; recent advances in magnet technology permit the use of higher magnetic fields of the order of 1–1.5 T in medical and biological NMR imaging. As the magnetic field increases, the chemical shift increases proportionately and becomes a greater problem. Chemical shift can produce the same effect as a spatial variation in the NMR signal. This results in chemical shift artifacts which are manifested as rings in multiple-angle-projection imaging and ghosts in two-dimensional-Fourier-transform (2DFT) imaging. Ghost artifacts, for example, may appear as a faint ring or ghost at one side of an image, and they obliterate some of the spatial information present. In proton imaging of the body, the chemical shift observed is principally between the hydrogens attached to oxygen in water ($H_2O$) and the hydrogens attached to carbon in alkyl —$CH_2$— groups found in lipid (fat) and other tissues. The effect of the chemical shift is to produce two superimposed images, with one image being the water image and the other image being the lipid image shifted by an amount corresponding to the chemical shift.

The observation and recognition of chemical shift artifacts in NMR imaging was first published by the present inventor, Paul A. Bottomley, in "A Versatile Magnetic Field Gradient Control System For NMR Imaging", J. Phys. E: Sci. Instrum., Vol. 14, 1981, where the expression:

$$g \geq \frac{2N\pi w^*}{\gamma a} \qquad (2)$$

is proposed for the minimum imaging gradient, g, required to resolve N pixels of a sample of spatial extent, a, containing a spectrum of chemical shifts, $\delta^*$, measured in frequency units to avoid chemical shift artifact. Since the chemical shift range in frequency units increases linearly with magnetic field strength and it is desirable to increase N to maximize spatial resolution, a condition is rapidly approached where practical gradient strengths are insufficient to satisfy equation (2). Furthermore, it is disadvantageous to increase the gradient strength beyond what is absolutely necessary due to inherent main field inhomogeneity, because this increases the frequency bandwidth of the NMR signal and therefore reduces the signal-to-noise ratio.

In general, it is not possible to correct for chemical shift artifacts from a single NMR scan by calculation unless prior knowledge is possessed of either the spatial information or the chemical shift spectral information, including the amplitudes of the peaks. Such knowledge would be contrary to the aim of an imaging experiment, which is to investigate the interior of an unknown object. Thus, chemical shift artifacts are a significant problem, particularly for high field imaging in homogeneous main magnetic fields.

It is therefore desirable to provide NMR imaging methods that overcome chemical shift artifacts. It is also desirable to provide NMR imaging methods that enable resolution of chemically-shifted species. For example, an image constructed from $CH_2$ lipid alone may prove useful for looking at fat or atherosclerotic lesions or plaques in blood vessels, as well as for the evaluation of heart disease.

BRIEF SUMMARY OF THE INVENTION

In accordance with a first embodiment of the invention, a method for NMR imaging that enables the NMR frequencies of selected chemically-shifted nuclei of the same species to be resolved, to allow images from the selected nuclei to be constructed without chemical shift artifacts, utilizes a step of selectively saturating or inverting the non-selected nuclei of a sample, by applying to the sample an RF pulse (termed a "sizzler" pulse) which has a narrow frequency spectrum about the chemically-shifted NMR frequency of the non-selected nuclei, prior to a conventional imaging sequence and adjusting the amplitude of the narrow-frequency-spectrum RF pulse so as to saturate or invert the non-selected nuclei such that these nuclei do not produce NMR signals during data acquisition in the imaging sequence.

An RF pulse having the desired spectral content may be formed by providing an RF carrier having a frequency equal, for example, to the NMR frequency of the nuclei it is desired to saturate, and amplitude-modulating that RF carrier with a waveform that controls the width and the shape of a resulting RF carrier pulse, so as to limit the frequency spectrum of the RF carrier pulse to a narrow band of frequencies about the NMR frequency of the nuclei to be saturated. The RF carrier pulse is applied to the sample in the absence of magnetic field gradients so as to saturate (or invert) the non-selected nuclei in the sample. For samples containing two chemically-shifted nuclei, the nuclei can be individually resolved and images constructed from each chemically-shifted nuclear species by sequentially saturating (or inverting) one nuclei and then the other. For samples containing more than two chemically-shifted nuclei, composite RF carrier pulses may be employed for simultaneously saturating, or inverting, all but the selected nuclei.

A second embodiment of the invention that enables resolution of different chemically-shifted species and enables NMR images of those species to be constructed without chemical shift artifacts, utilizes the chemical shift selective "sizzler" pulse in an otherwise conventional NMR imaging sequence of the form of either a selective excitation 90° or 180° RF pulse as part of a 90°-$\tau$-180° spin echo or a 90°-$\tau$-180°-2$\tau$-180°-2$\tau$-180° ... Carr-Purcell RF pulse sequence, where $\tau$ is a preselected fixed time interval between pulses. In both cases, the selective excitation pulse is applied in the absence of applied imaging magnetic field gradients and tailored to select only the chemically-shifted nuclear species that it is desired to image. In cases where selective excitation is also used in the imaging sequence, for plane selection for example, image plane selection must be performed using a different RF pulse than that pulse used for selecting the chemical shift species.

BRIEF DESCRIPTION OF THE DRAWINGS

FIG. 1 illustrates diagrammatically an NMR sample situated in a static magnetic field and having a planar volume defined therein by selective excitation;

FIGS. 2a and 2b are 64 MHz proton ($^1$H) spectra from an entire human head and thigh, respectively, illustrating two chemically-shifted peaks corresponding to water and lipid protons;

DETAILED DESCRIPTION OF THE PREFERRED EMBODIMENT

Figure 3:
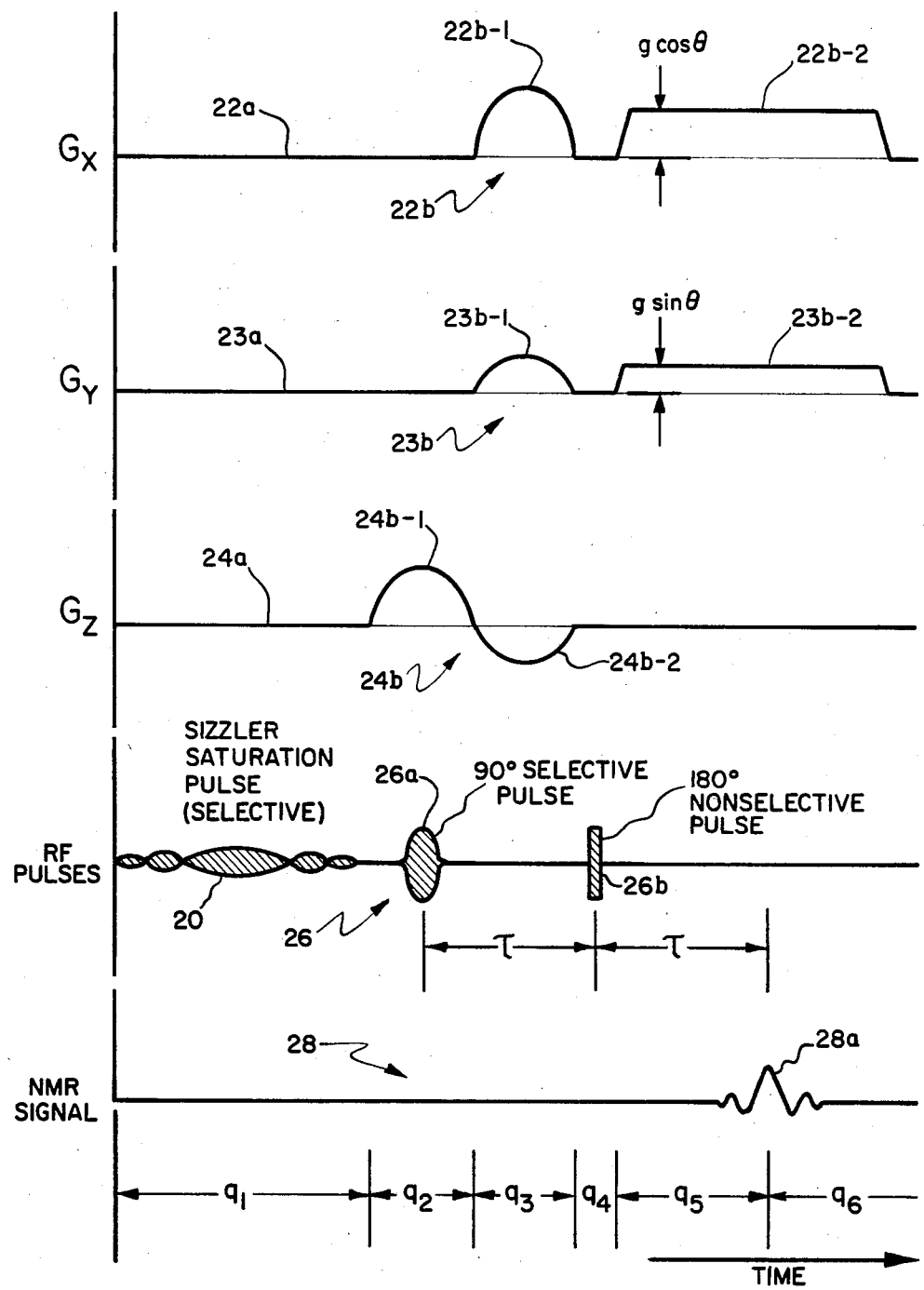
FIGS. 3 and 4 illustrate the use of a saturation pulse in accordance with the invention with typical NMR imaging pulse sequences, respectively for a multiple-angle-projection imaging sequence and for a two-dimensional-Fourier-transform (spin-warp) imaging sequence.

The invention is particularly well adapted for use with NMR proton imaging for resolving water and lipid peaks, i.e., NMR signals, and for overcoming chemical shift artifacts produced thereby, and will be described in that environment. However, as will be appreciated, this is illustrative of only one utility of the invention.

Prior to describing the invention, it will be helpful to review briefly some of the basics of NMR imaging. FIG. 1 illustrates an NMR sample 10, which may, for purposes of illustration and explanation, be cylindrically shaped. Sample 10 is positioned in a static homogeneous main magnetic field $B_o$ directed along the positive z-axis direction of a conventional Cartesian coordinate system, the z-axis being selected to be coincident with the axis 11 of the sample. The origin of the coordinate system is chosen as the center of the sample, which is also the center of a thin planar slab or imaging volume 12 of the sample selected by selective irradiation of the sample in the presence of magnetic field gradients. Typically, three such gradients are employed for imaging:

$$G_x(t) = \partial B_o/\partial x \qquad (3)$$

$$G_y(t) = \partial B_o/\partial y \qquad (4)$$

$$G_z(t) = \partial B_o/\partial z \qquad (5)$$

The gradients $G_x$, $G_y$ and $G_z$ are generally different functions of time t, and have associated magnetic fields $b_x$, $b_y$ and $b_z$, respectively, wherein $$b_x = G_x(t)x \quad (6)$$

$$b_y = G_y(t)y \quad (7)$$

$$b_z = G_z(t)z \quad (8)$$

As will be described more fully hereinbelow, the gradients are applied to the sample along with RF magnetic field pulses as part of an imaging pulse sequence to selectively excite and detect NMR signals from different portions of the sample. The RF pulses are directed orthogonal to the $B_o$ field and are used, for example, in combination with the magnetic field gradients to excite nuclei in a specific planar region to resonance.

FIGS. 2a and 2b illustrate 64 MHz $^1$H spectra 14 and 16, respectively, recorded from an entire human head and thigh, respectively, in a magnetic field of 1.5 T. The two peaks 14a and 14b or 16a and 16b of each spectra correspond to the protons on water ($H_2O$) (peaks 14a and 16a)s and alkyl groups (—$CH_2$—) (peaks 14b and 16b), respectively. It will be seen that the relative intensities of the peaks vary with the tissue studied and with the individual: there is less —$CH_2$— alkyl component observed in the brain spectrum 14b, compared to the thigh spectrum 16b, for example. However, the —$CH_2$— NMR component in the head is still sufficient to generate a ghost artifact at the periphery of 2DFT head images, as previously described. From FIGS. 2a and 2b, it can be seen that the —$CH_2$— peaks 14b and 16b are shifted approximately +3.5 ppm from the respective water peaks 14a and 16a (e.g. roughly about 220 Hz) and have a linewidth of the order of 1 ppm (i.e. about 64 Hz) at their midpoints.

In accordance with a first embodiment of the invention, the NMR signals corresponding to the lipid may be suppressed by applying to the sample, prior, but close in time, to the normal imaging sequence, an RF selective "sizzler" saturation pulse having: (1) frequency components in a narrow frequency band centered on the —$CH_2$— resonance frequency; and (2) an amplitude sufficient to saturate the —$CH_2$— nuclei, i.e., sufficient to cause the spins to go into an excited state so that they do not produce NMR signals during the imaging sequence. The bandwidth of the sizzler pulse should be wide enough to cover the frequency spread of the —$CH_2$— peak 14b or 16b, but narrow enough to avoid saturating the frequency region associated with the water nuclei peaks 14a and 16a. For the spectra illustrated in FIGS. 2a and 2b, the sizzler pulse may have a bandwidth $BW_s$ of the order of 1 ppm, e.g. about 64 Hz (at 1.5 T).

The sizzler pulse may be produced in a number of different ways. For example, an RF generator set to the frequency of the nuclei which are to be saturated, inverted or otherwise excited, may be pulse-modulated or gated to provide an RF pulse of the correct frequency and bandwidth. The bandwidth of the sizzler pulse can be controlled by controlling either or both of the pulse duration and the pulse shape. As is well known, a square-shaped RF pulse having a width, i.e., duration, of t seconds will irradiate approximately a 2/t frequency band centered on the RF frequency of the pulse. Thus, a pulse having a duration t of 32 msec. will have a bandwidth of about 62.5 Hz, which is approximately equal to the 1 ppm bandwidth of the —$CH_2$— peaks 14b or 16b of FIGS. 2a or 2b. However, a square pulse undesirably has frequency components which extend beyond this frequency range, because such a pulse has the well-known frequency profile that varies as (sin $\omega$)/$\omega$. It is desirable to utilize, as a sizzler pulse, a pulse having much sharper bandwidth edges, so as to excite a more sharply-defined response. Pulses having the desired bandwidth may be produced by amplitude-modulating an RF pulse with an appropriate waveform so as to confine the frequency components of the pulse to the desired bandwidth. Many such waveforms are available and may be employed. One such waveform, for example, is a Gaussian waveform, which produces a Gaussian frequency distribution. Another waveform which may be employed is (sin bt)/bt, where b is a constant, since such a modulated RF pulse has frequency components contained within a rectangular profile in the frequency domain. To compensate for ringing in the frequency domain due to finite truncation of the (sin bt)/bt modulation, a Hanning window may also be applied to the RF pulse to attenuate its side lobes by modulating the pulse envelope with a Hanning function. The Gaussian and (sin bt)/bt modulation waveforms are examples of two of many different types of waveforms which may be employed and which are contemplated by the present invention.

As previously noted for the first embodiment, the sizzler pulse is applied to the sample in the absence of gradients and prior, but close in time, to the normal imaging sequence. The effect of saturating the lipid nuclei is to remove the alkyl —$CH_2$— frequencies from the NMR signals produced during the normal imaging sequence, thereby enabling the water peak 14a or 16a to be resolved and chemical shift artifacts, produced by peaks 14b or 16b, to be avoided. Moreover, the invention conveniently enables and further extends to the saturation of the water nuclei response peaks 14a or 16a so that the —$CH_2$— response peak regions 14b and 16b can be resolved to construct a —$CH_2$— image, which, being sensitive to fat content, may be useful for locating atherosclerotic lesions or plaques in blood vessels and for the evaluation of heart disease.

In the second embodiment, the sizzler pulse is incorporated into the imaging sequence to select and excite the desired nuclear species for observation, rather than remove it by saturation; centering the sizzler pulse on the water peak 14a or 16a in FIGS. 2a or 2b, respectively will preclude the appearance in the image of chemical shift artifacts from other species in the spectrum, and generate an image of only the water component. An image reflecting the —$CH_2$— component can be obtained by selecting only the lipid component 14b or 16b in the same manner.

The invention, of course, may be also be applied to other than proton imaging. For example, for imaging other nuclei having multiple chemically-shifted peaks, composite pulses may be used to saturate all but selected nuclei to enable resolution of their respective peak (or peaks) for imaging.

Figure 4:
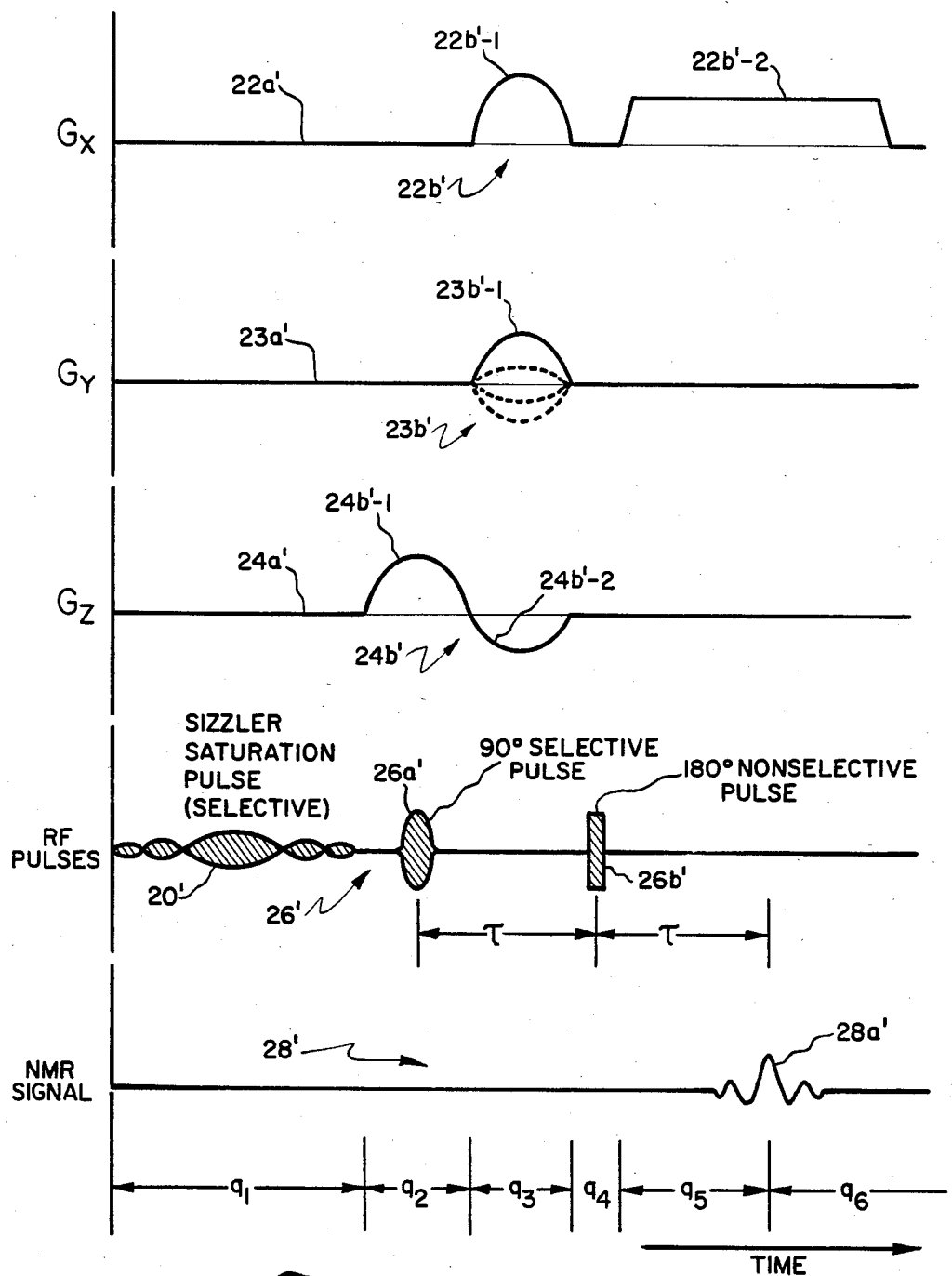

The invention is not restricted to any particular NMR imaging sequence, many of which are known, and in general may be employed with any of the known imaging sequences. FIGS. 3 and 4 are exemplary of two different imaging sequences with which the invention may be employed. FIG. 3 illustrates the first embodiment of the invention employed with a multiple-angle-projection imaging sequence, and FIG. 4 illustrates another embodiment of the invention employed with a two-dimensional-Fourier-transform (spin-warp) imaging sequence. These two imaging sequences are described in detail in U.S. patent application Ser. No. 345,444, filed Feb. 3, 1982, now U.S. Pat. No. 4,471,306, issued Sept. 11, 1984, assigned to the same assignee as the present invention, and incorporated in its entirety by reference herein. Accordingly, the imaging sequence of FIGS. 3 and 4 will be described only generally.

Referring to FIG. 3, a rather long sizzler saturation pulse 20, constructed in the manner previously described, is applied to the sample in the absence of applied imaging magnetic field gradients, e.g. while the $G_x$, $G_y$ and $G_z$ gradient signal portions 22a, 23a and 24a all have zero magnitudes, during a first time period $q_1$. The amplitude envelope and frequency of pulse 20 are selected to saturate undesired, e.g., lipid, nuclei in the sample.

Following the sizzler saturation pulse 20, a normal multiple-angle-projection imaging sequence, of gradient signals 22b, 23b and 24b and RF pulse signal 26, is applied to the sample during time period $q_2$–$q_6$ to excite the nuclei in a selected x-y plane, and the resulting NMR signals 28 are Fourier-transformed to provide a projection along a radial line in the plane defined by the magnitudes of the x and y gradients.

As shown, in time period $q_2$, a narrow-frequency-band 90° selective RF pulse 26a is applied in the presence of a positive gradient $G_z$ portion 24a–1 to select the desired x-y plane. The RF pulse 26a may be formed by amplitude-modulating an RF carrier having a frequency equal to the Larmor frequency of the selected plane with a Gaussian, a (sin bt)/bt of the like waveform to limit the frequency spectrum of the pulse to a narrow band about the frequency of the selected plane. Although in the context of a normal imaging sequence the bandwidth of the 90° selective pulse 26a is considered to be "narrow", in relation to the sizzler saturation pulse, its excitation spectrum is quite large and may be of the order of 1 KHz or so. During time period $q_3$, a negative $G_z$ gradient portion 24b–2 is applied, to rephase the spins excited in time period $q_2$ along with dephasing positive gradients $G_x$ portion 22b–1 and $G_y$ portion 23b–1 applied in the x and y directions, respectively. Following a short waiting period to allow the currents in the gradient windings to subside, a 180° nonselective inverting RF pulse 26b is applied to the sample during time period $q_4$ at a time $\tau$ following the 90° selective pulse 26a. This produces a spin-echo NMR signal 28a at time $\tau$ following the 180° pulse 26b, which signal 28a is read out in the presence of gradients $G_x$ portion 22b–2 and $G_y$ portion 23b–2, having amplitudes respectively equal to (g cos Θ) and to (g sin Θ), respectively, which define the angle Θ of the particular radial line along which the projection is taken. The imaging sequence illustrated in FIG. 3 may be repeated a large number of times for different values of Θ (at 1° intervals, for example) to cover at least a 180° arc in the imaging plane, and the resulting data (NMR signals 28a) may be processed to construct an image. A sizzler pulse 20 preceeds each of the repetitions of the multiple-angle—projection sequence.

FIG. 4 illustrates the sizzler saturation pulse 20' employed with a two-dimensional-Fourier-transform (2DFT) imaging sequence for spin-warp imaging. As before, the sizzler saturation pulse 20' is formed to saturate selected chemical shifted nuclei and is applied to the sample in the absence of gradients (e.g. $G_x$, $G_y$ and $G_z$ portions 22a', 23a' and 24a' are substantially of zero magnitude) during time period $q_1$. During period $q_2$, a 90° selective RF pulse 26a' is applied in the presence of a positive $G_z$ gradient portion 24b'–1, to selectively excite an imaging plane. During time period $q_3$, a negative $G_z$ gradient portion 24b'–2 is applied to rephase the nuclear spins in the planar region excited during the time period $q_2$, along with a dephasing positive G gradient portion 22b'–1 and with a phase-encoding $G_y$ gradient portion 23b'–1. Following a short time interval to allow the currents in the gradient windings to subside, a 180° nonselective inverting RF pulse 26b' is applied during time period $q_4$ at a time $\tau$ following the 90° selective pulse 26a', and a positive rephasing $G_x$ gradient 22b'–2 is applied during time periods $q_5$ and $q_6$ to obtain the spatial nuclear spin information along the x-axis at a time $\tau$ following the 180° pulse 26b'.

The phase-encoding $G_y$ gradient portion 23b'–1 is applied in the y-axis direction during time period $q_3$ in order to introduce a twist in the spins in the y-axis direction. The spatial information encoded by the different phases of the spins causes spins at different x positions to precess at different frequencies, enabling separation of the return signals 28a' at each x position. During subsequent imaging sequences, different values of $G_y$ portion 23b'–1 are employed (as indicated by the dotted lines) to give different projections, and a complete planar image is reconstructed by a two-dimensional-Fourier-transformation of the projections. The sizzler saturation pulse 20' is applied just prior to the normal spin-warp imaging sequence (starting at time $q_2$) for each repetition.

FIGS. 3 and 4 are examples of but two imaging sequences with which the invention may be employed, and the invention is applicable to other imaging sequences as well.

As noted earlier, the sizzler saturation pulse may be employed for saturating first the alkyl (—$CH_2$—) nuclei in hydrogen ($^1H$) spectra so that the resulting image is constructed from only the water nuclei response and is free of chemical shift artifacts. The sizzler pulse may then be employed to saturate the water nuclei and an image constructed from the —$CH_2$— nuclei. For imaging samples containing more than two chemically-shifted species, the sizzler pulse may be a composite pulse comprising two or more saturation pulses, each formed to saturate different nuclei to enable other selected nuclei to be imaged.

Figure 5:
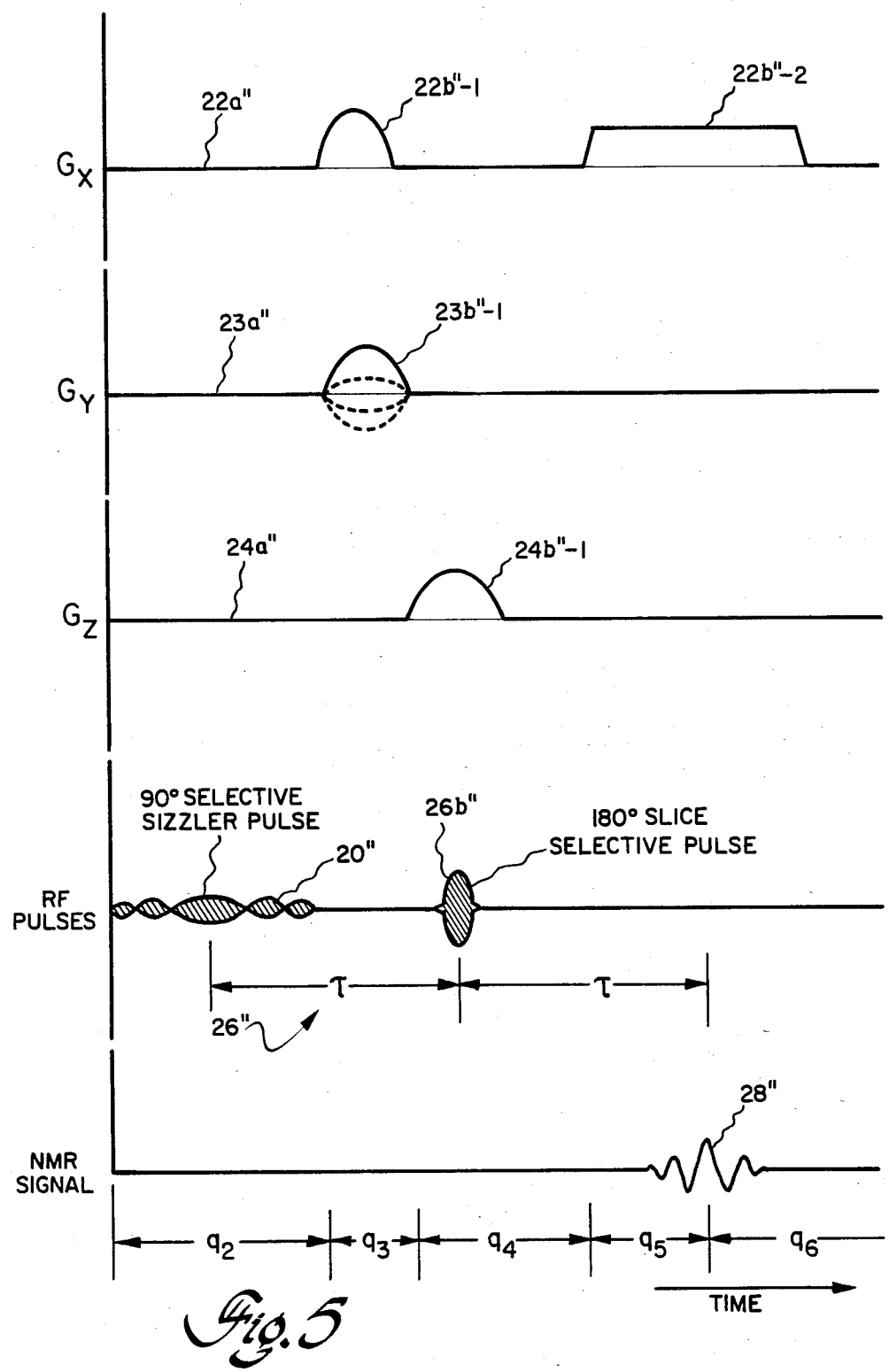
FIGS. 5 and 6 illustrate other presently preferred embodiments, in which the chemical shift selective (saturation) pulse is a 90° or a 180° excitation pulse, respectively, incorporated into a conventional two-dimensional-Fourier-transform (2DFT) NMR imaging sequence.
Figure 6:
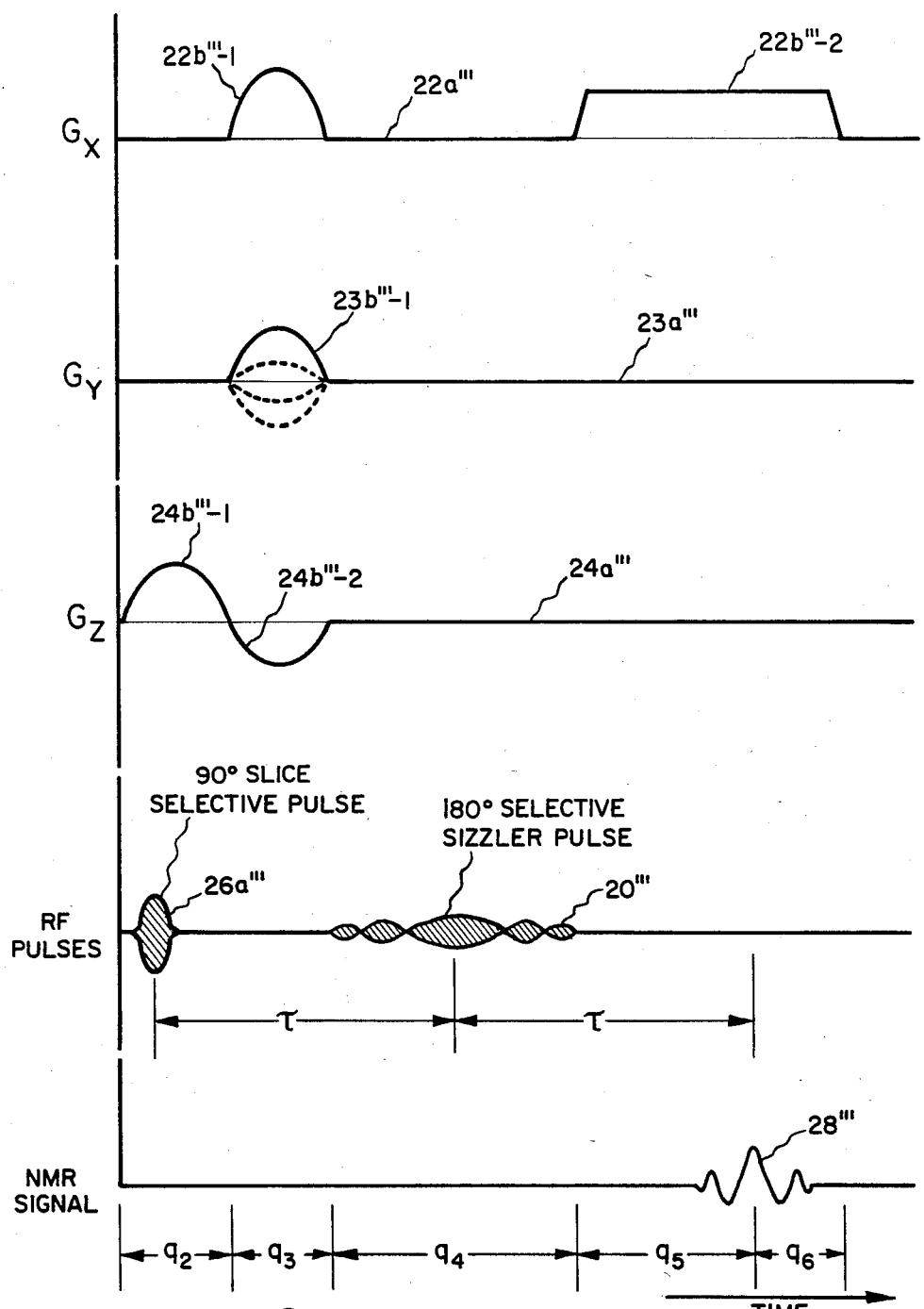

FIGS. 5 and 6 illustrate a second embodiment of the invention wherein the sizzler pulse is incorporated into conventional NMR imaging pulse sequences to replace one of the existing RF pulses, thereby eliminating sizzler pulse application during interval $q_1$. For example, FIG. 5, illustrates the application to the 2DFT spin-warp imaging sequence using a sizzler pulse 20" as the 90° excitation pulse in a first interval $q_2$ of the sequence 26". The 90° pulse in interval $q_2$ was formerly used for slice selection in FIGS. 3 and 4, but since selection of the desired chemically-shifted species must take place in the absence of applied imaging gradients 22a''', 23a" and 24a", the slice selection portion of the sequence is shifted to a 180° pulse 26b" in later time interval $q_4$. The excitation bandwidth of the 90° sizzler pulse 20" is adjusted to excite only the bandwidth of the desired nuclear species as before, while the amplitude of 90° sizzler pulse 20" is adjusted to produce a 90° selective pulse for those species. After subsidence of the 90° pulse, a positive $G_x$ gradient portion 22b"–1, and a phase-encoding $G_y$ gradient portion 23b''−1 are applied during interval $q_3$, similar to the sequence in FIG. 4. Thereafter, a slice-selective 180° RF pulse 26b'' is applied during interval $q_4$, in the presence of a $G_z$ gradient 24b'−1 to select an imaging plane perpendicular to the z-axis. The NMR spin-echo signal 28'' is again sampled in the presence of a uniform x-gradient 22b''−2 in intervals $q_5$ and $q_6$. During subsequent imaging sequences, different values of $G_y$ portion 23b''−1 are employed (as indicated by the dotted lines) to give different projections, and a complete planar image is reconstructed by a two-dimensional-Fourier-transformation of the projections.

FIG. 6 illustrates an application of the second embodiment to the 2DFT spin-warp imaging sequence, using a sizzler pulse 20''' as the 180° excitation pulse in time interval $q_4$ of the sequence. The application of gradient, RF pulses and data acquisition in intervals $q_2$, $q_3$, $q_5$ and $q_6$ occurs in the same manner as in like time intervals of the sequence of FIG. 4. However, in interval $q_4$, the 180° pulse 26b' is replaced by a 180° sizzler pulse 20''' with appropriately adjusted excitation bandwidth, and amplitude corresponding to a 180° pulse for the selected nuclear species.

Pulse schemes corresponding to the projection reconstruction method (FIG. 3) for the second embodiment can be utilized by substituting the $G_x$ gradient sequence (signals 22b'''−1, 22a''' and 22b'''−2) and the $G_y$ gradient sequence (signals 23b'''−1 and 23a'''), similar to those of FIG. 3, into the same intervals of FIGS. 5 and 6.

As noted earlier, the sizzler excitation pulse may be employed for selecting first and —CH$_2$— nuclei in hydrogen ($^1$H) spectra so that the resulting image is constructed from only the —CH$_2$— nuclei response and is free of chemical shift artifacts. The sizzler pulse may then be employed to excite the water nuclei and an image constructed from the water nuclei.

Figure 7:
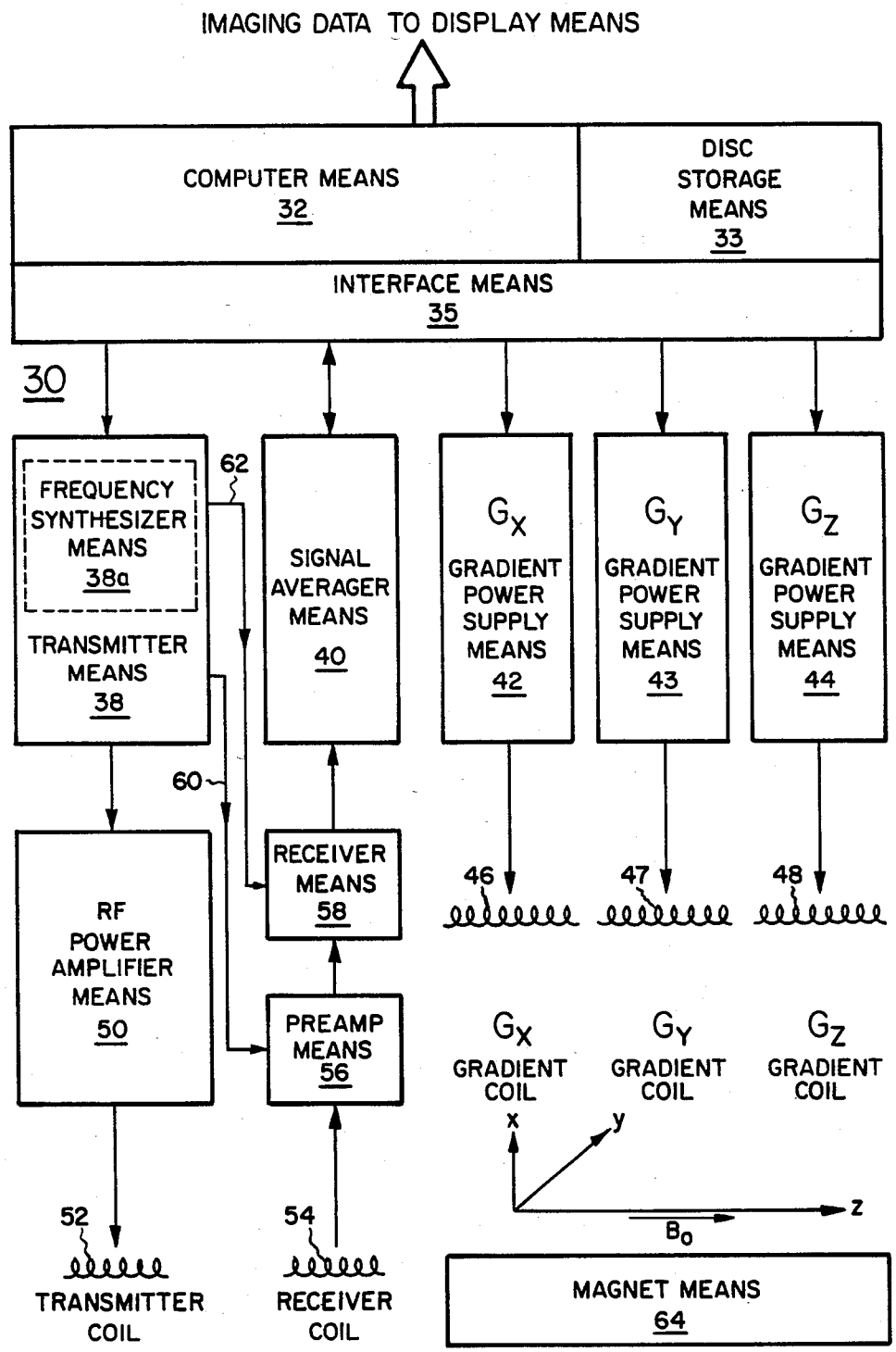
FIG. 7 is a simplified block diagram of NMR imaging apparatus suitable for practicing the method of the present invention.

FIG. 7 is a simplified block diagram of an NMR imaging system 30 for use with the invention. The system comprises a general-purpose computer means 32 coupled to a disc storage means 33 and an interface means 35. An RF transmitter means 38, signal average means 40 and gradient power supplies means 42, 43 and 44 for energizing, respective, x, y and z gradient coils 46, 47 and 48, are all coupled to the computer means 32 through the interface means 35.

RF transmitter means 38 can be employed for generating both the sizzler saturation pulse 20, 20', 20'' or 20''' and the RF pulses 26a and 26b, 26a' and 26b', 26a'' and 26b'', 26a''' and 26b''' and the like, required for the 20 imaging sequences illustrated in FIGS. 3-6. The pulses may be amplified in RF power amplifier means 50 and applied to a transmitter coil 52. The NMR imaging signals are generated responsive to the signal applied by coil 52 to the sample. The resulting NMR signals may be received by a receiver coil 54, amplified in a low noise preamplifier means 56, and filtered and detected by a receiver means 58. The receiver means output signal may be digitized and averaged by signal averager means 40, and the resulting data may be processed by the computer for constructing the image and for providing an imaging display, as on a CRT display. The preamplifier means 56 and receiver means 58 are usually protected from the RF pulses by gating or blanking signals provided on lines 60 and 62 from the transmitter or from the computer, and also by passive filtering. A magnet means 64 provides the static homogeneous main magnetic field $B_o$.

Computer means 32 is employed for controlling the system and may provide the voltage waveforms for the gradient power supplies means 42-44. Transmitter means 38 preferably comprises at least one programmable frequency synthesizer means 38a, controlled by the computer, for generating RF carriers of the required frequencies for the sizzler saturation pulse and for the RF imaging pulses, gating circuitry for controlling the widths of the RF pulses, and modulators for applying envelope modulation waveforms to the RF pulses. The modulation waveforms may be generated in the computer. For saturating multiple chemically-shifted nuclei simultaneously, transmitter means 38 may contain multiple RF frequency modulation (FM) circuitry and amplitude modulators.

The parameters of the sizzler saturation or excitation pulse 20, 20', 20'' or 20''' required to saturate or excite particular chemically-shifted nuclei may be determined in several different ways. For example, the frequency of the sizzler saturation pulse may be determined by running the system and adjusting the frequency synthesizer 38a of transmitter means 38 until its frequency matches the NMR frequency of the selected chemically-shifted nuclei. The pulse width and pulse strength of the RF pulse may then be adjusted until the NMR signal 28 or 28' due to the chemically-shifted nuclei disappears where sizzler saturation pulses are employed, or for a maximum FID or spin-echo signal 28'' or 28''', respectively, where sizzler 90° or 180° pulses are respectively utilized. In proton imaging, for example, to suppress signals due to —CH$_2$— nuclei with a sizzler saturation pulse, a bottle containing lipid (rich in —CH$_2$—) material may also be placed adjacent to the sample to assist in centering the frequency of the transmitter means synthesizer. Once the parameters of the sizzler saturation pulse have been determined, the computer may control the synthesizer frequency during imaging to switch back and forth between the frequency of the sizzler saturation pulse and the frequency of pulses 26a/26b or 26a'/26b' corresponding to the seelected imaging plane. Alternatively, since the 90° selective pulse 26a/26a' has a spectrum which is quite a bit larger than that of the sizzler saturation pulse, and the chemical shift offsets are rather small in most cases, the transmitter means synthesizer frequency may simply be set to the frequency of the chemically-shifted nuclei to be saturated and the modulation waveforms and pulse widths controlled in accordance with the type of pulse to be generated. A frequency offset of several parts per million for the 90° selective pulse, for example, will have very little detrimental effect since the pulse will still have frequency components about the NMR frequency of the selected imaging plane.

While a preferred embodiment of the invention has been shown and described, it will now be apparent to those skilled in the art that many variations and modifications in this embodiment may be made without departing from the principles and spirit of the invention, and that I desire the scope of my invention to be defined only by the appending claims.

What I claim is:

1. A method for NMR imaging with selected nuclei of a sample also containing undesired nuclei of the same species and having chemically-shifted NMR frequencies, and comprising the steps of:

(a) irradiating the sample with a pulsed RF magnetic field having a carrier frequency essentially at the chemically-shifted NMR frequency of the undesired, non-selected nuclei;

(b) selecting a pulse width to substantially confine the frequency spectrum of the pulsed irradiating RF magnetic field of step (a) substantially to a narrow band of frequencies selected to lie about the chemically-shifted NMR frequency of the non-selected nuclei and to essentially exclude NMR frequencies of the selected nuclei;

(c) applying to the sample an NMR imaging signal sequence selected to evoke NMR response signals from the selected nuclei;

(d) adjusting the amplitude of the irradiating RF field of step (a) to saturate the non-selected nuclei and prevent the non-selected nuclei from producing NMR signals as part of the NMR response signals responsive to the NMR imaging sequence of step (c); and (e) processing the resulting NMR response signals, received from the sample responsive to the imaging signal sequence of step (c), to provide an image of the distribution of the selected nuclei in the sample and substantially devoid of contribution by the undesired nuclei.

2. The method of claim 1, wherein step (d) further comprises the step of: forming the envelope of the RF pulse to substantially prevent pulse frequency components from occurring at the NMR frequency of the selected nuclei.

3. The method of claim 1, wherein the RF pulse width selecting step (b) includes the step of: selecting a maximum pulse time interval ($t_m$) to cause the quantity ($1/t_m$) to be less than the difference between the chemically-shifted frequencies of the selected and the non-selected nuclei; and setting the pulse width to be (t) seconds in duration, where (t) is less than ($t_m$), to produce an RF carrier of narrow frequency band of about (2/t) Hz wide.

4. The method of claim 3, further comprising the step of: amplitude-modulating the RF carrier pulse with a preselected waveform substantially confining the frequency spectrum of the RF carrier pulse to the selected narrow band of frequencies.

5. The method of claim 4, wherein the preselected waveform is a Gaussian waveform.

6. The method of claim 4, wherein the preselected waveform is of the form (sin bt)/bt, where b is a constant.

7. The method of claim 6, further comprising the step of: truncating the (sin bt)/bt waveform by modulating the envelope of the RF carrier pulse with another preselected waveform selected to reduce ringing due to said truncation.

8. The method of claim 7, wherein the another preselected waveform is a Hanning function.

9. The method of claim 1, further comprising the step of: amplitude-modulating the RF carrier pulse with a preselected waveform substantially confining the frequency spectrum of the RF carrier pulse to the selected narrow band of frequencies.

10. The method of claim 9, wherein the preselected waveform is a Gaussian waveform.

11. The method of claim 9, wherein the preselected waveform is of the form (sin bt)/bt, where b is a constant.

12. The method of claim 11, further comprising the step of: truncating the (sin bt)/bt waveform by modulating the envelope of the RF carrier pulse with another preselected waveform selected to reduce ringing due to said truncation.

13. The method of claim 11, wherein the another preselected waveform is a Hanning function.

14. The method of claim 1, further comprising the step of: performing at least steps (a), (b) and (d) in the presence of a static main magnetic field having a magnitude of at least 0.5 T applied to the sample.

15. The method of claim 14, wherein the static main magnetic field is of the order of 1.5 T.

16. The method of claim 1, further comprising the step of: performing steps (c), (d) and (e) in the absence of applied magnetic field gradients.

17. The method of claim 1, wherein the sample contains multiple species of nuclei each having chemically-shifted NMR frequencies, and further comprising the step of: providing the RF magnetic field pulse as a composite RF magnetic field having a selected set of frequencies each occurring about the chemically-shifted NMR frequencies of each non-selected one of the multiple nuclei species; and adjusting the magnitude of each RF magnetic field pulse to simultaneously saturate each associated species of non-selected nuclei.

18. The method of claim 1, wherein the imaging signal sequence is a multiple-angle-projection imaging signal sequence.

19. The method of claim 1, wherein said imaging signal sequence is a two-dimensional-Fourier-transfrom spin-warp imaging signal sequence.

20. The method of claim 1, wherein said nuclei comprise water ($H_2O$) nuclei and alky ($-CH_2-$) nuclei, and steps (a), (b) and (d) are performed to saturate a selected one of the water and alkyl nuclei, to provide an NMR image responsive to the other one of the nuclei and substantially free from chemical shift artifacts from the chosen nuclei.

21. A method for resolving NMR signals, from selected nuclei of a sample containing first and second nuclei having chemically-shifted NMR frequencies, to overcome chemical shift artifacts in NMR imaging, comprising the steps of:

(a) applying an imaging signal sequence to the second nuclei of the sample;

(b) selectively saturating the first nuclei, in the absence of all magnetic gradient fields, to cause the first nuclei of the sample to substantially not produce NMR signals while the second nuclei of the sample respond to the imaging signal sequence of step (a);

(c) collecting the NMR signals produced by the second nuclei responsive to the imaging signal sequence; and (d) processing the collected NMR signals to form an image substantially free of chemical shift artifacts from the first nuclei.

22. The method of claim 21, further comprising the steps of: (e) thereafter selectively saturating the second nuclei instead of the first nuclei; and (f) repeating the collecting and processing steps (c) and (d) for the NMR signals produced by the first nuclei, to form an image substantially free of chemical shift artifacts from the second nuclei.

23. The method of claim 21, wherein the saturating step (b) comprises the steps of: (b1) applying to the sample, prior to the imaging signal sequence, an RF carrier pulse signal having a carrier frequency substantially centered at the chemically-shifted NMR frequency of the first nuclei; (b2) adjusting the waveshape of the carrier pulse signal to remove substantially all of the pulse frequency components at the chemically-shifted NMR frequency of the second nuclei; and (b3) increasing the amplitude of the carrier pulse signal to a level sufficient to saturate the first nuclei.

24. The method of claim 23, wherein the adjusting step (b2) comprises the steps of: controlling the time duration of the RF carrier signal pulse to a pulse width of (t) seconds, where (t) is selected to provide a frequency half-bandwidth of about (1/t) Hz which is less than the separation between the chemically-shifted NMR frequencies of the first and second nuclei; and amplitude-modulating the RF carrier pulse signal with a waveform preselected to confine the frequency spectrum substantially to a bandwidth of about 2/t Hz about the chemically-shifted NMR frequency of the first nuclei.

25. The method of claim 23, further comprising the step of: applying the RF carrier pulse signal to the sample at a time, close, but prior, to the beginning of the imaging signal sequence of step (a).

26. The method of claim 21, further comprising the step of: repeating steps (a), (c) and (d), in sequence a multiple number of times to obtain multiple imaging projections of the sample, and step (b) comprises the step of: selectively saturating the first nuclei prior to each repetitive occurrence of the imaging signal sequence applying step (a).

27. The method of claim 21, wherein the first nuclei comprise protons attached to —$CH_2$— molecular groups, and the second nuclei comprise protons attached to water molecules.

28. A method for NMR imaging with desired nuclei of a sample containing both desired and undesired nuclei of the same species and having multiple chemically-shifted NMR frequencies, and comprising the steps of:
(a) applying an NMR imaging signal sequence, for imaging of the desired nuclei, to the sample;
(b) processing the resulting NMR signals recieved from the desired nuclei of the sample responsive to the imaging signal sequence in step (a);
(c) irradiating the sample, during a portion of the NMR imaging signal sequence in step (a) when magnetic field gradients are not applied to the sample, with an RF magnetic field at the chemically-shifted NMR frequency of selected undesired nuclei;
(d) confining the irradiating RF magnetic field of step (c) substantially to a selected narrow band of frequencies about the chemically-shifted NMR frequency of the selected undesired nuclei; and
(e) adjusting the amplitude of the irradiating RF magnetic field of step (c) to excite the desired nuclei during the imaging signal sequence of step (a).

29. The method of claim 28, wherein the irradiating step (c) comprises the steps of: applying to the sample an RF carrier pulse signal with a frequency essentially equal to the chemically-shifted NMR frequency of the selected nuclei; and the confining step (d) comprises the step of: selecting a pulse width to substantially confine the frequency spectrum of the RF carrier signal pulse to the selected narrow band of frequencies.

30. The method of claim 29, wherein step (d) further comprises the step of: forming the amplitude envelope of the RF carrier signal pulse to substantially prevent pulse frequency components from occurring at the NMR frequency of the non-selected nuclei.

31. The method of claim 30, wherein step (e) further comprises the step of adjusting the amplitude of the irradiating RF magnetic field to cause the selected nuclei to receive a 90° selective RF pulse.

32. The method of claim 30, wherein the RF carrier signal pulse width selecting step includes the step of: selecting a maximum pulse time interval ($t_m$) to cause the quantity ($1/t_m$) to be less than the difference between the chemically-shifted frequencies of the desired nuclei and the selected undesired nuclei; and setting the pulse width to be (t) seconds in duration, where (t) is less than ($t_m$), to produce an RF carrier of narrow frequency band of about (2/t) Hz wide.

33. The method of claim 31, further comprising the step of: amplitude-modulating the RF carrier signal pulse with a preselected waveform substantially confining the frequency spectrum of the RF carrier signal pulse to the selected narrow band of frequencies.

34. The method of claim 33, wherein the preselected waveform is a Gaussian waveform.

35. The method of claim 33, wherein the preselected waveform is of the form (sin/bt)/bt, where b is a constant.

36. The method of claim 35, further comprising the step of: truncating the (sin bt)/bt waveform by modulating the envelope of the RF carrier pulse with another preselected waveform selected to reduce ringing due to said truncation.

37. The method of claim 36, wherein the another preselected waveform is a Hanning function.

38. The method of claim 30, wherein step (c) further comprises the step of adjusting the amplitude of the irradiating RF magnetic field to cause the selected nuclei to receive a 180° RF selective pulse.

39. The method of claim 38, wherein the RF carrier signal pulse width selecting step includes the step of: selecting a maximum pulse time interval ($t_m$) to cause the quantity ($1/t_m$) to be less than the difference between the chemically-shifted frequencies of the desired nuclei and the selected undesired nuclei; and setting the pulse width to be (t) seconds in duration, where (t) is less than ($t_m$), to produce an RF carrier of narrow frequency band of about (2/t) Hz wide.

40. The method of claim 39, further comprising the step of: amplitude-modulating the RF carrier signal pulse with a preselected waveform substantially confining the frequency spectrum of the RF carrier signal pulse to the selected narrow band of frequencies.

41. The method of claim 40, wherein the preselected waveform is of the form (sin/bt)/bt, where b is a constant.

42. The method of claim 41, further comprising the step of: truncating the (sin/bt)/bt waveform by modulating the envelope of the RF carrier pulse with another preselected waveform selected to reduce ringing due to said truncation.

43. The method of claim 42, wherein the another preselected wavefrom is a Hanning function.

44. The method of claim 28, further comprising the step of: performing at least steps (c), (d) and (e) in the presence of a static main magnetic field having a magnitude of at least 0.5 T applied to the sample.

45. The method of claim 44, wherein the static main magnetic field is of the order of 1.5 T.

46. The method of claim 28, wherein the imaging signal sequence is a multiple-angle-projection imaging signal sequence.

47. The method of claim 28, wherein said imaging signal sequence is a two-dimensional-Fourier-transform spin-warp imaging signal sequence.

48. The method of claim 28, wherein said nuclei comprise water ($H_2O$) nuclei and alkyl ($-CH_2-$) nuclei, and steps (c), (d) and (e) are performed to select one of the water and alkyl nuclei, to provide an NMR image responsive to the other one of the nuclei and substantially free from chemical shift artifacts from the selected nuclei.

49. A method for resolving NMR signals from a selected nuclei species, of a sample containing a plurality of nuclei species each having at least one of selected and non-selected multiple chemically-shifted NMR frequencies, to overcome chemical shift artifacts in NMR imaging, comprising the steps of:
  (a) applying an NMR imaging signal sequence to the sample;
  (b) selectively exciting, during a portion of the imaging sequence, devoid of applied magnetic gradient fields, substantially only a first selected nuclei species to cause the first selected nuclei species to substantially produce NMR signals while the sample responds to the imaging signal sequence of step (a);
  (c) collecting the NMR signals produced by the first selected nuclei species responsive to the imaging signal sequence of step (a); and
  (d) processing the collected NMR signal to form an image of the first selected nuclei species, which image is substantially free of chemical shift artifacts from others of the multiple chemically-shifted nuclei species.

50. The method of claim 49, further comprising the steps of: (e) thereafter exciting substantially only a second selected species of the chemically-shifted nuclei, instead of the first selected nuclei species; and (f) repeating the collecting and processing steps (c) and (d) for the NMR signals produced by the second selected species of nuclei, to form an image of the second selected species of nuclei, which image is substantially free of chemical shift artifacts from others of the multiple nuclei species.

51. The method of claim 49, wherein the exciting step (b) comprises the steps of: (b1) applying to the sample, during the imaging signal sequence, an RF carrier signal pulse having a carrier frequency substantially centered at the chemically-shifted NMR frequency of the first selected nuclei species; (b2) adjusting the waveshape of the carrier signal pulse to remove substantially all of the pulse frequency components at all other of the chemically-shifted NMR frequencies of the remainder of the multiple nuclei species; and (b3) adjusting the amplitude of the carrier signal pulse to a level sufficient to excite the first selected nuclei species.

52. The method of claim 51, wherein the adjusting step (b2) comprises the step of: controlling the time duration of the RF carrier signal pulse to a pulse width of (t) seconds, where (t) is selected to provide a frequency half-bandwidth of about (1/t) Hz which is less than the separation between the chemically-shifted NMR frequencies of the first selected nuclei species and the remainder of the nuclei species; and amplitude-modulating the RF carrier signal pulse with a waveform preselected to confine the frequency spectrum substantially to a bandwidth on the order of about 2/t Hz about the chemically-shifted NMR frequency of the first selected nuclei species.

53. The method of claim 51, further comprising the step of: applying the RF carrier pulse signal to the sample at a time at the beginning of the imaging signal sequence.

54. The method of claim 51, wherein step (b2) comprises the step of: adjusting the amplitude of the RF carrier signal pulse to cause the selected first nuclei species to receive a substantially 90° selective RF pulse.

55. The method of claim 51, wherein step (b2) comprises the step of: adjusting the amplitude of the RF carrier signal pulse to cause the selected first nuclei species to receive a substantially 180° selective RF pulse.

56. The method of claim 49, further comprising the step of: repeating steps (a), (c) and (d) repeatedly a multiple number of times to obtain multiple imaging projections of the sample, and step (b) comprises the step of: selectively exciting the first selected nuclei species during each repetitive occurrence of the imaging signal sequence applying step (a).

57. The method of claim 49, wherein the first selected nuclei species comprise protons attached to $-CH_2-$ molecular groups, and a second nuclei species comprise protons attached to water molecules.

58. The method of claim 1, wherein step (b) further comprises the step of: adjusting the magnitude of the radiating RF magnetic field at the chemically-shifted NMR frequency of the non-selected nuclei, to cause the selected nuclei to receive a substantially 90° pulse.

* * * * *